United States Patent
Kim et al.

(10) Patent No.: US 11,244,911 B2
(45) Date of Patent: Feb. 8, 2022

(54) CHIP INCLUDING A SCRIBE LANE

(71) Applicant: SAMSUNG ELECTRONICS CO., LTD., Suwon-si (KR)

(72) Inventors: Yoon Sung Kim, Hwaseong-si (KR); Yun Hee Kim, Hwaseong-si (KR); Byung Moon Bae, Hwaseong-si (KR); Hyun Su Sim, Hwaseong-si (KR); Jun Ho Yoon, Hwaseong-si (KR); Jung Ho Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 206 days.

(21) Appl. No.: 16/389,367

(22) Filed: Apr. 19, 2019

(65) Prior Publication Data

US 2020/0126932 A1 Apr. 23, 2020

(30) Foreign Application Priority Data

Oct. 18, 2018 (KR) .................. 10-2018-0124651

(51) Int. Cl.
*H01L 23/58* (2006.01)

(52) U.S. Cl.
CPC .................. *H01L 23/585* (2013.01)

(58) Field of Classification Search
CPC ......... H01L 23/3192; H01L 2924/3512; H01L 2924/35121; H01L 23/544; H01L 2223/5448; H01L 2223/54486; H01L 23/585

See application file for complete search history.

(56) References Cited

U.S. PATENT DOCUMENTS

| | | | |
|---|---|---|---|
| 8,435,868 B2 | 5/2013 | Shigihara et al. | |
| 9,559,005 B2 | 1/2017 | Tsai et al. | |
| 9,559,063 B2 | 1/2017 | Watanabe et al. | |
| 9,837,326 B2 | 12/2017 | Yajima | |
| 2008/0164468 A1* | 7/2008 | Chen | H01L 23/585 257/48 |
| 2010/0283129 A1 | 11/2010 | Tetani et al. | |
| 2011/0057297 A1* | 3/2011 | Lee | H01L 23/562 257/620 |
| 2014/0339712 A1 | 11/2014 | Alvarado et al. | |
| 2015/0214077 A1 | 7/2015 | Tsia et al. | |
| 2016/0148842 A1 | 5/2016 | Ho et al. | |
| 2017/0062292 A1 | 3/2017 | Yajima | |
| 2017/0271276 A1 | 9/2017 | Ho et al. | |

FOREIGN PATENT DOCUMENTS

| | | |
|---|---|---|
| JP | 2010-192867 A | 9/2010 |
| JP | 2014-027057 A | 2/2014 |

* cited by examiner

*Primary Examiner* — Latanya N Crawford Eason
(74) *Attorney, Agent, or Firm* — Sughrue Mion, PLLC

(57) ABSTRACT

A semiconductor chip includes a substrate including: a main chip region; and a scribe lane surrounding the main chip region; a lower interlayer insulating layer disposed on the substrate in the scribe lane; a circuit structure disposed on the lower interlayer insulating layer in the scribe lane; and a pad structure disposed on the lower interlayer insulating layer. The circuit structure and the pad structure are disposed to be spaced apart from each other in a longitudinal direction of the scribe lane.

17 Claims, 12 Drawing Sheets

CHIP INCLUDING A SCRIBE LANE

CROSS-REFERENCE TO RELATED APPLICATION

This application claims priority under 35 U.S.C. § 119 from Korean Patent Application No. 10-2018-0124651, filed on Oct. 18, 2018 in the Korean Intellectual Property Office, the disclosure of which is incorporated herein by reference in its entirety.

BACKGROUND

1. Field

Apparatuses consistent with example embodiments relate to a semiconductor chip including a scribe lane and a method of manufacturing the same.

2. Description of Related Art

As semiconductor devices are scaled down and highly integrated, an insulating layer disposed between adjacent interconnection layers is used as a low-k dielectric material so as to inhibit the generation of parasitic capacitance between the interconnection layers. However, the low-k dielectric material has a lower strength and is weaker than a typical conventional insulating layer.

In a laser sawing process, cracks are formed in a back surface of a wafer and then the cracks are vertically progressed to separate semiconductor chips. In the case of a wafer including an insulating layer made of a low-k dielectric material, it is difficult for cracks to progress vertically due to the low strength of the low-k dielectric material, and instead a peeling phenomenon may occur in which an oxide layer disposed in a scribe lane is peeled off.

SUMMARY

Various example embodiments provide a semiconductor device having a scribe lane structure capable of preventing peeling or non-separation of an oxide layer in a sawing process in which a wafer is severed into individual semiconductor chips.

According to an aspect of an example embodiment, there is provided a semiconductor chip which includes a substrate including: a main chip region; and a scribe lane surrounding the main chip region; a lower interlayer insulating layer disposed on the substrate in the scribe lane; a circuit structure disposed on the lower interlayer insulating layer in the scribe lane; and a pad structure disposed on the lower interlayer insulating layer. The circuit structure and the pad structure are disposed to be spaced apart from each other in a longitudinal direction of the scribe lane.

According to an aspect of another example embodiment, there is provided a semiconductor chip which includes a substrate including a main chip region; and a scribe lane surrounding the main chip region and forming a side surface of the semiconductor chip; a lower interlayer insulating layer disposed on the substrate in the scribe lane; and a stacked structure including: a low-k dielectric layer; and an upper interlayer insulating layer, the low-k dielectric layer and the upper interlayer insulating layer being sequentially stacked on the lower interlayer insulating layer. The stacked structure may further include: a passivation layer; and metal pad layers, the passivation layer and the metal pad layers being disposed on the upper interlayer insulating layer. An upper surface of the lower interlayer insulating layer and a first sidewall and a second sidewall of the stacked structure provided on opposite sides of the stacked structure along a longitudinal direction of the scribe lane are exposed.

According to an aspect of another example embodiment, there is provided a semiconductor chip which includes a substrate including a main chip region; and a scribe lane surrounding the main chip region; a stacked structure extending along a longitudinal direction of the scribe lane, provided on the substrate in the scribe lane and including a low-k dielectric material; an open region in which the stacked structure is partially removed; and a pad structure disposed in the open region. The pad structure is disposed to be spaced apart from the stacked structure in the longitudinal direction of the scribe lane.

BRIEF DESCRIPTION OF THE DRAWINGS

The above and other aspects, features and advantages will be more clearly understood from the following detailed description taken in conjunction with the accompanying drawings in which.

DETAILED DESCRIPTION

Figure 1:
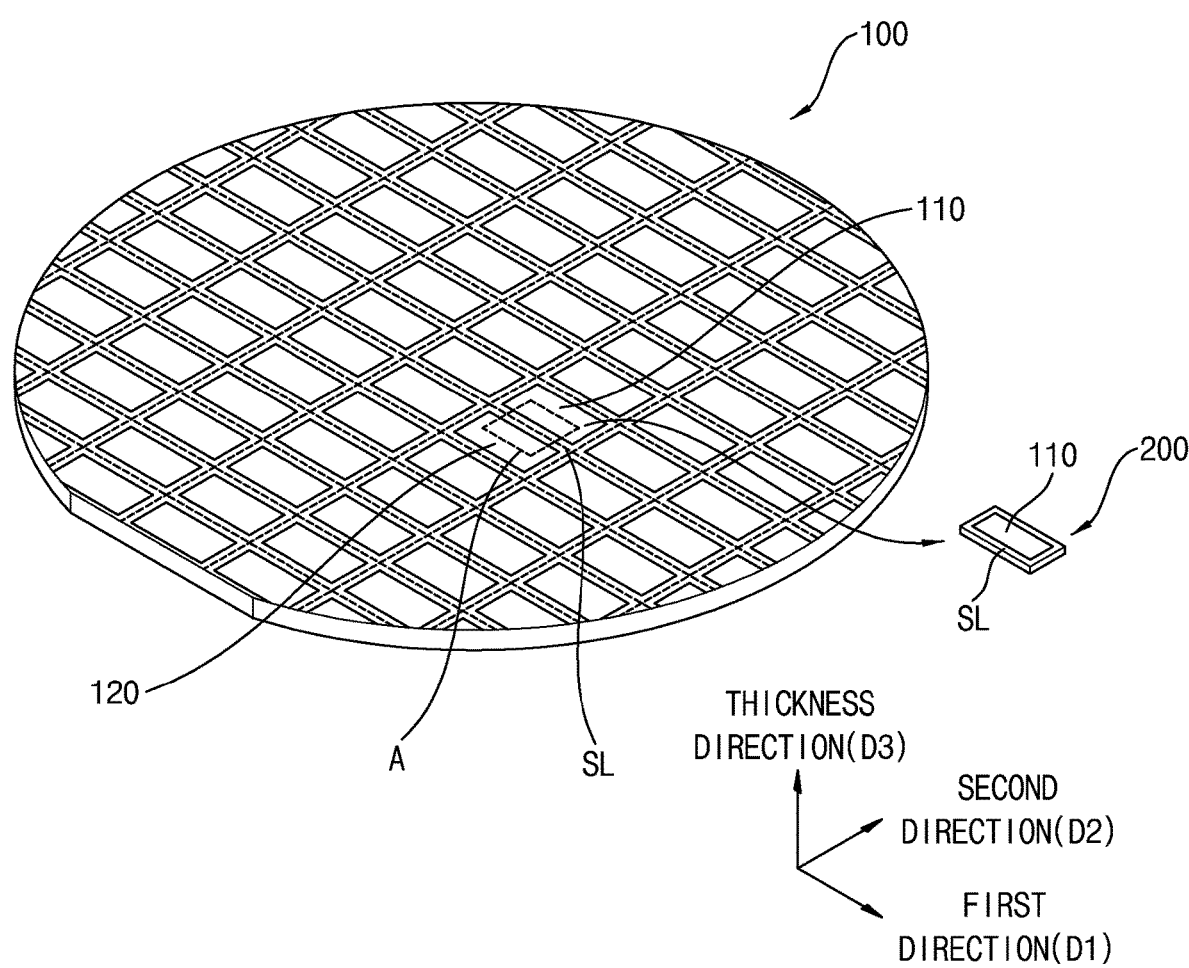
FIG. 1 is a perspective view schematically showing a semiconductor wafer according to an example embodiment.
Figure 2:
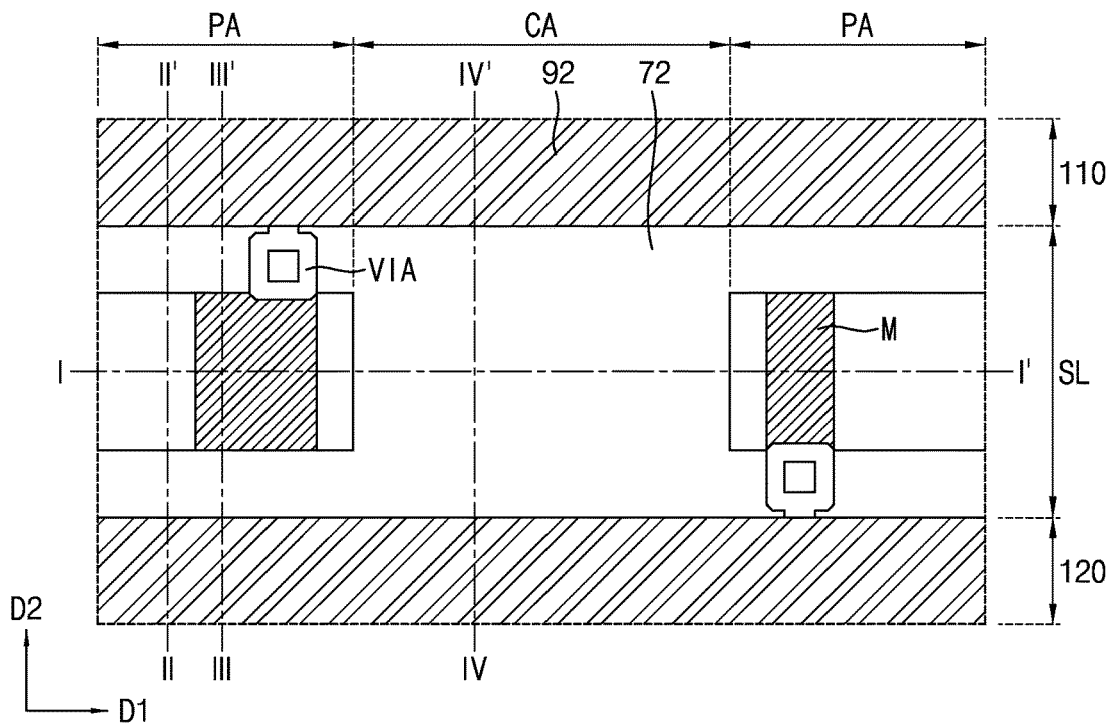
FIG. 2 is an enlarged view showing region A of FIG. 1.
Figure 3:
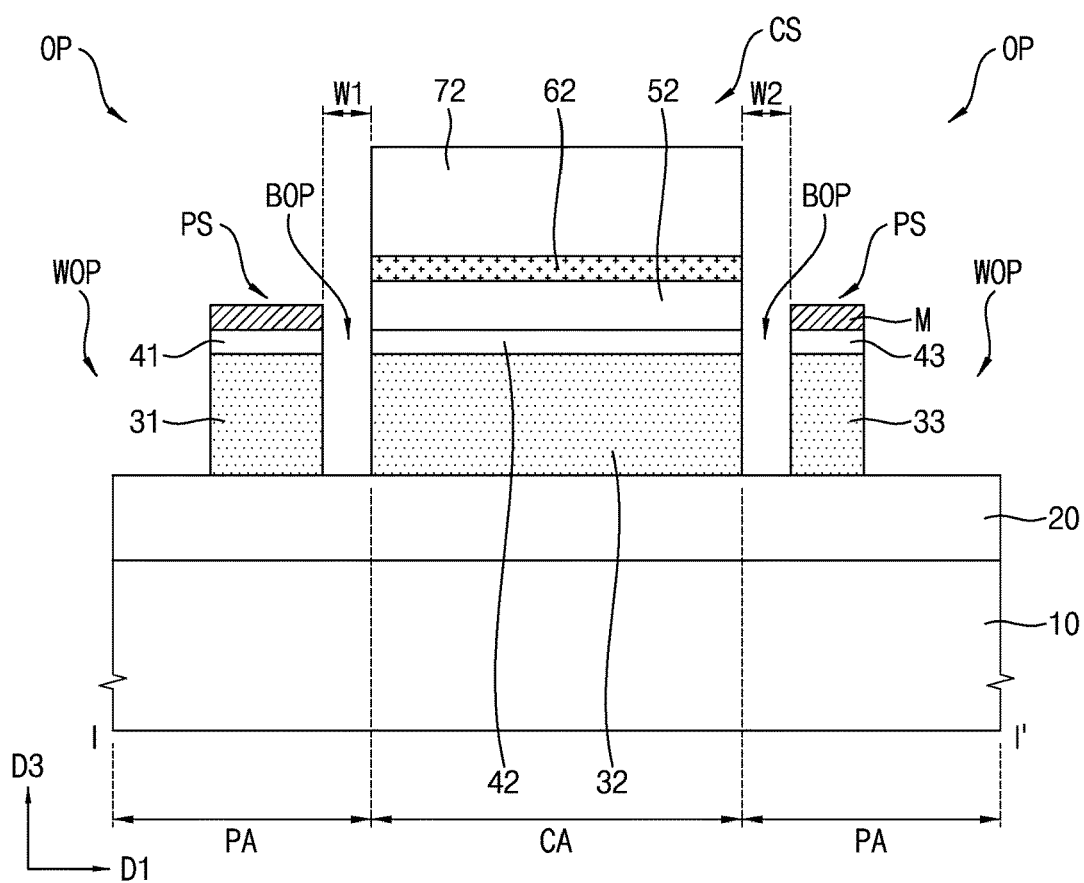
FIG. 3 is a vertical sectional view taken along line I-I' of FIG. 2.
Figure 4:
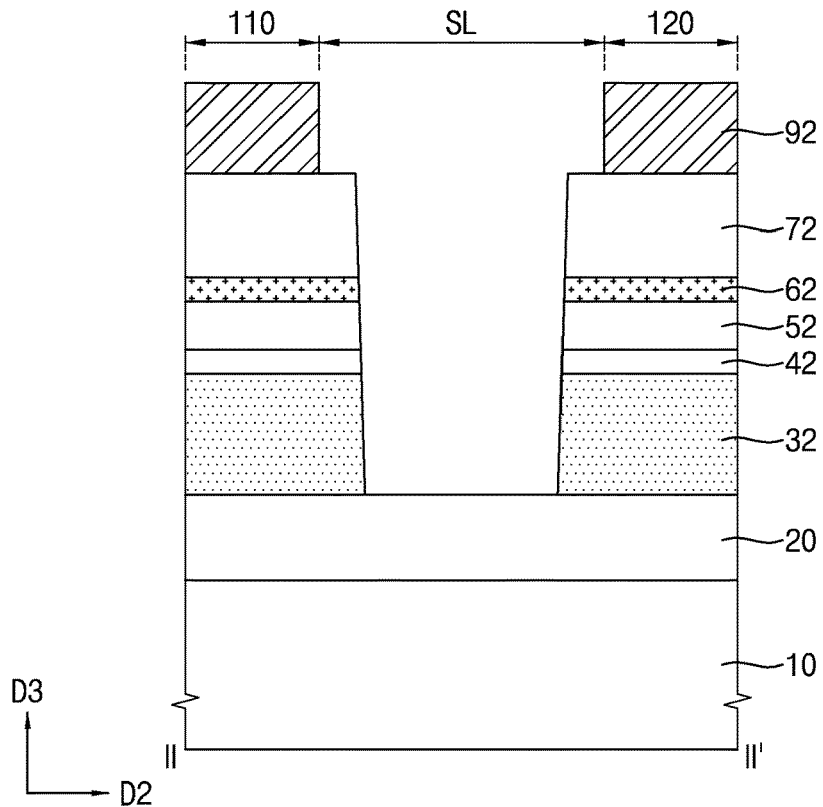
FIG. 4 is a vertical sectional view taken along line II-IF of FIG. 2.
Figure 5:
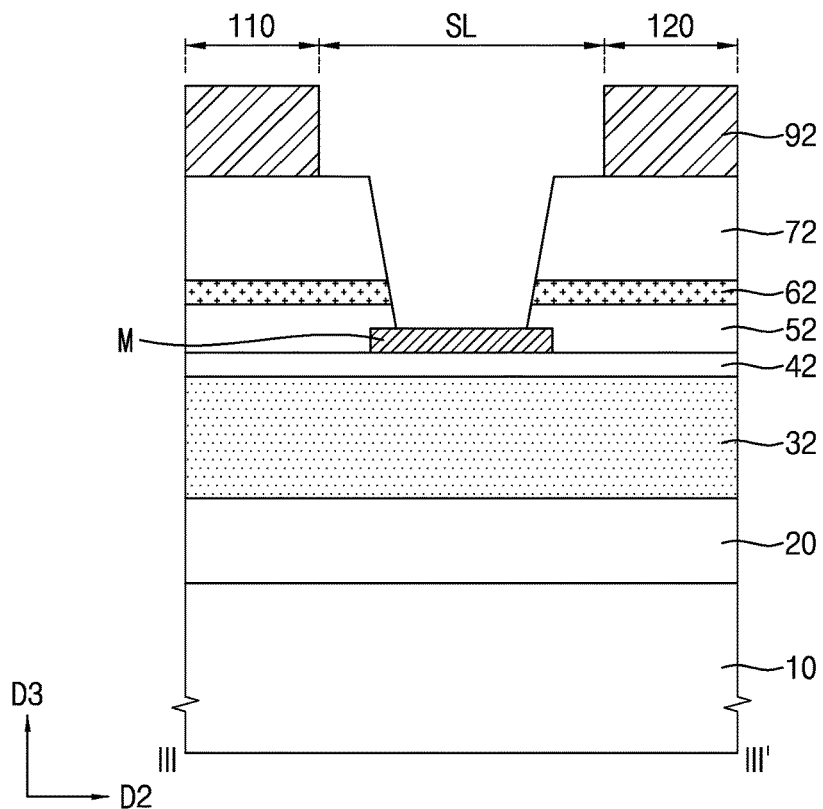
FIG. 5 is a vertical sectional view taken along line of FIG. 2.
Figure 6:
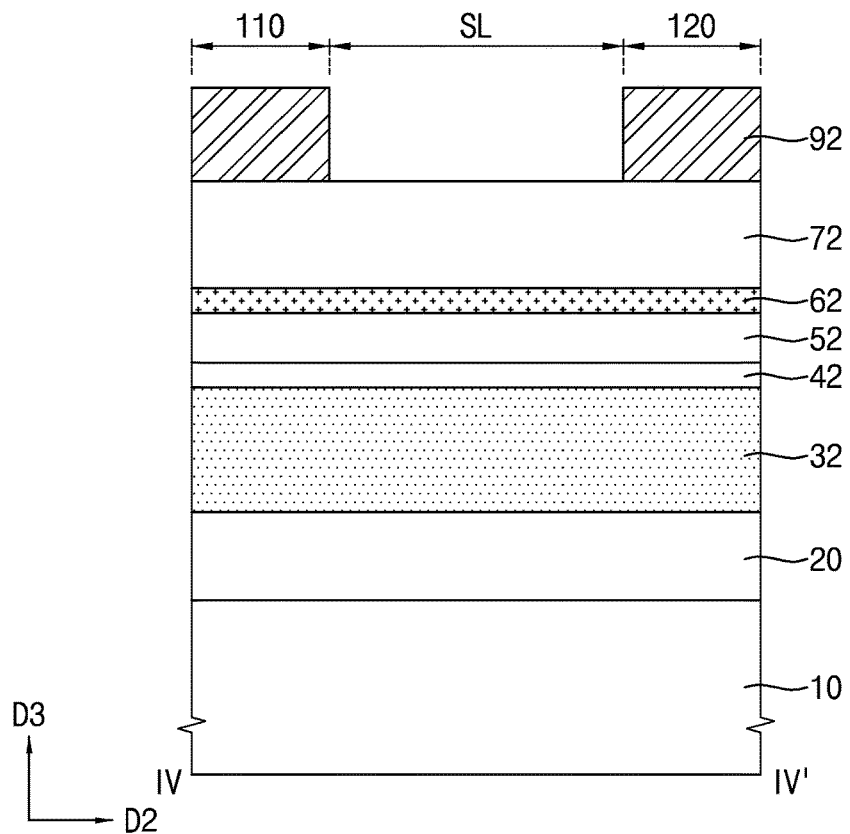
FIG. 6 is a vertical sectional view taken along line IV-IV' of FIG. 2.

FIG. 1 is a perspective view schematically showing a semiconductor wafer 100 according to an example embodiment. FIG. 2 is an enlarged view showing region A of FIG. 1. FIG. 3 is a vertical sectional view taken along line I-I' of FIG. 2. FIG. 4 is a vertical sectional view taken along line II-II' of FIG. 2. FIG. 5 is a vertical sectional view taken along line III-III' of FIG. 2. FIG. 6 is a vertical sectional view taken along line IV-IV' of FIG. 2.

Referring to FIG. 1, a semiconductor wafer 100 according to an example embodiment may include a plurality of main chip regions 110 and 120 and scribe lanes SL. For example, the semiconductor wafer 100 of FIG. 1 represents a semiconductor wafer before a separation process, such as a sawing process, is performed on the semiconductor wafer to obtain individual semiconductor chips. The main chip regions 110 and 120 may include semiconductor devices (not shown) of which a manufacturing process is completed. In FIG. 1, an example in which the main chip regions 110 and 120 are rectangular is shown. The scribe lanes SL may be disposed between the main chip regions 110 and 120. In other words, the scribe lanes SL may surround the main chip regions 110 and 120. The main chip regions 110 and 120 may be spaced apart from each other by having the scribe lanes SL therebetween. The scribe lane SL may refer to a region of the semiconductor wafer 100 in which a chip separation process (e.g., a sawing process) is performed.

The semiconductor wafer 100 may be severed into a plurality of individual semiconductor chips 200 along dicing lines (dotted lines in FIG. 1) in the scribe lanes SL. The semiconductor wafer 100 may be physically severed into the plurality of semiconductor chips 200 as various layers/films made of different types of material formed on the semiconductor wafer 100 are cut by a sawing process. The main chip region 110 may be disposed on a central portion of the semiconductor chip 200, and the cut scribe lane SL may be disposed at an edge of the semiconductor chip 200 while surrounding the main chip region 110. The scribe lane SL may form a sidewall of the semiconductor chip 200.

Referring to FIGS. 2 to 6, in the semiconductor wafer 100, the scribe lane SL may be disposed between the main chip regions 110 and 120, and a width of the scribe lane SL may be defined by a lapping layer 92 disposed on the main chip regions 110 and 120. The lapping layer 92 may be disposed on upper surfaces of the main chip regions 110 and 120. The lapping layer 92 may cover the semiconductor devices disposed in the main chip regions 110 and 120 to stably insulate the semiconductor devices from the exterior and to physically, chemically, and electrically protect the semiconductor devices from the external elements. In the example embodiment, the lapping layer 92 may include a photosensitive polyimide.

The semiconductor wafer 100 may include a substrate 10 having a circuit region CA and pad regions PA, and a lower interlayer insulating layer 20 disposed on the substrate 10. The lower interlayer insulating layer 20 may include oxide, and may include, for example, tetraethyl orthosilicate (TEOS) or high density plasma (HDP). Although not shown in the drawings, transistors may be formed on the substrate 10 and lower interconnection layers electrically connected to the transistors may be included in the lower interlayer insulating layer 20.

The circuit region CA may be disposed between the pad regions PA in a first direction (FIGS. 2 and 3) which is a longitudinal direction of the scribe lane SL. A circuit structure CS may be disposed in the circuit region CA. The circuit structure CS may fully cover the circuit region CA in the scribe lane SL as shown in FIG. 3. In a plan view, upper and lower ends of one side surface of the circuit structure CS may extend in the first direction and be disposed in the pad region PA, and upper and lower ends of another side surface of the circuit structure CS may extend in a direction opposite to the first direction and be disposed in the pad region PA.

The circuit structure CS may include a low-k dielectric layer 32, an upper interlayer insulating layer 42, and passivation layers 52, 62, and 72. The passivation layers 52, 62, and 72 may include a first insulating layer 52, a second insulating layer 62, and a third insulating layer 72. The low-k dielectric layer 32 may include a low-k dielectric material. The low-k dielectric layer 32 may have a dielectric constant which is lower than that of silicon oxide ($SiO_2$). For example, the low-k dielectric layer 32 may include a dielectric constant which is lower than 3.9. For example, the low-k dielectric layer 32 may include an impurity-doped silicon oxide-based material, a porous silicon oxide, or an organic polymer. For example, the impurity-doped silicon oxide-based material may include fluorine-doped oxide or fluorosilicate glass (FSG) film, a carbon-doped oxide film, a silicon oxide film, hydrogen silsesquioxane (HSQ; SiO:H), methyl silsesquioxane (MSQ; SiO:CH3), or a-SiOC (SiOC:H). The organic polymer may include a polyallyl ether-based resin, cyclic fluororesin, a siloxane copolymer, a fluorinated polyallyl ether-based resin, polypentafluorostyrene resin, polytetrafluoro styrene resin, fluorinated polyimide resin, polynaphthalene fluoride resin, or polycide resin. The upper interlayer insulating layer 42, the first insulating layer 52, and the third insulating layer 72 may include oxide and the second insulating layer 62 may include nitride. For example, the upper interlayer insulating layer 42 and the third insulating layer 72 may include TEOS, the first insulating layer 52 may include HDP, and the second insulating layer 62 may include silicon nitride (SiN). However, materials included in the example embodiments are not limited to the above-described materials.

An open region OP may be formed in the pad region PA, and a pad structure PS and a via VIA may be disposed in the pad region PA. An upper surface of the lower interlayer insulating layer 20 may be exposed through the open region OP. The open region OP may include a wide open region WOP and a bridge open region BOP. The bridge open region BOP may be formed between the circuit structure CS and the pad structure PS, and the wide open region WOP may be formed on an opposite side of the bridge open region BOP with respect to the pad structure PS along the first direction as shown in FIG. 3. In an example embodiment, a width of the bridge open region BOP in the first direction may be 8 µm or less. The widths of the adjacent bridge open regions BOP (provided at opposite sides of the circuit structure CS along the first direction) may be identical to or different from each other.

The pad structure PS may include low-k dielectric patterns 31 and 33, upper interlayer insulating patterns 41 and 43, and metal pad layers M, which are sequentially stacked on the lower interlayer insulating layer 20. The metal pad layer M may be disposed to pass through a center of the scribe lane SL. The metal pad layer M may have a width similar to a width of the open region OP in a second direction, but the example embodiment is not limited thereto. A width of the metal pad layer M in the first direction may correspond to a width of the via VIA in the first direction and may be greater than the width of the via VIA in the first direction.

In an example embodiment, distances (in the first direction) W1 and W2 between the metal pad layers M and the first insulating layer 52 in the first direction may be 8 µm or less. When the distances W1 and W2 between the metal pad layers M and the first insulating layer 52 in the first direction are 8 µm or less, vertical progression of cracks formed in the substrate 10 when the semiconductor wafer 100 is severed (or separated) is facilitated by the support of the metal pad layer M. Therefore, the semiconductor chips may be efficiently separated without peeling off the upper interlayer insulating layer 42 and/or the passivation layers 52, 62, and 72.

In an example embodiment, as shown in FIG. 3, the distances W1 and W2 between the metal pad layers M and the first insulating layer 52 in the first direction may correspond to the width of the bridge open region BOP in the first direction. However, the example embodiment is not limited thereto, and the distances W1 and W2 between the metal pad layers M and the first insulating layer 52 in the first direction may be 8 μm or less and may be greater than the width of the bridge open region BOP in the first direction.

The via VIA may be disposed on the passivation layers 52, 62, and 72 of the circuit structure CS in the pad region PA. That is, the via VIA may be disposed on the third insulating layer 72. In an example embodiment, the via VIA may be disposed so as to be close to any one of the first main chip region 110 and the second main chip region 120 which are separated having the scribe lane SL including metal pad layer M therebetween. In FIG. 2, the via VIA disposed on a left side (along the first direction) is shown as being disposed close to the first main chip region 110 and the via VIA disposed on a right side (along the first direction) is shown as being disposed close to the second main chip region 120, but the example embodiment is not limited thereto. For example, both of the vias VIA in FIG. 2 may be disposed close to the first main chip region 110 or close to the second main chip region 120. Although not shown in the drawings, a position of an upper end of the via VIA may correspond to a position of an upper end of the lapping layer 92 (in the thickness direction. A via hole vertically passing through the via VIA may be formed in the via VIA. For example, the via VIA may include at least one of metals such as tungsten, copper, and the like.

Figure 7:
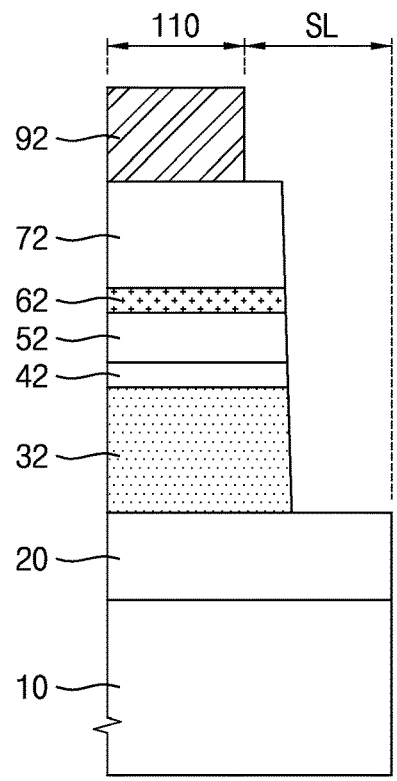
FIG. 7 is a vertical sectional view taken along line II-II' of the divided semiconductor chip when a semiconductor wafer is divided along line I-I' of FIG. 2.
Figure 8:
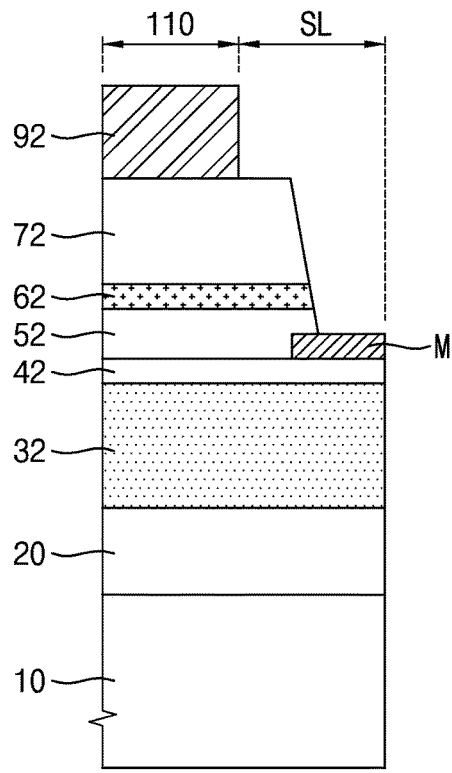
FIG. 8 is a vertical sectional view taken along line of the divided semiconductor chip when the semiconductor wafer is divided along line I-I' of FIG. 2.
Figure 9:
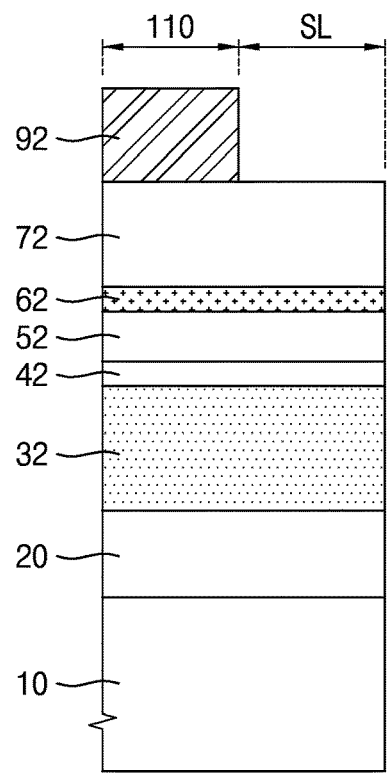
FIG. 9 is a vertical sectional view taken along line IV-IV' of the divided semiconductor chip when the semiconductor wafer is divided along line I-I' of FIG. 2.

FIG. 7 is a vertical sectional view taken along line II-II' of the severed/separated semiconductor chip 200 when the semiconductor wafer 100 is severed along line I-I' of FIG. 2. FIG. 8 is a vertical sectional view taken along line III-III' of the severed semiconductor chip 200 when the semiconductor wafer 100 is severed along line I-I' of FIG. 2. FIG. 9 is a vertical sectional view taken along line IV-IV' of the severed semiconductor chip 200 when the semiconductor wafer 100 is divided along line I-I' of FIG. 2. In FIGS. 1 to 9, like reference numerals denote like components. Hereinafter, for simplification of description, substantially the same contents as those described in FIGS. 1 to 6 will be omitted.

Referring again to FIGS. 1 to 3, the semiconductor chips 200 individually cut from the semiconductor wafer 100 may have a tetragonal shape having four sides. In an example embodiment, at least one of four exposed side surfaces of at least one of the semiconductor chips 200 individually divided from the semiconductor wafer 100 may include the configuration as shown in FIG. 3. For example, when the semiconductor wafer 100 is cut along line I-I' (see FIG. 2) on the scribe lane SL, one side surface of the severed semiconductor chips 200, which corresponds to a region taken along line I-I', may include the cross section as shown in FIG. 3.

Referring to FIGS. 1, 2, and 7, a stepped structure through which the upper surface of the lower interlayer insulating layer 20 is exposed may be formed on at least one side surface of the semiconductor chip 200.

Referring to FIGS. 1, 2, and 8, a stepped structure through which an upper surface of the metal pad layer M is exposed may be formed on at least one side surface of the semiconductor chip 200. Further, a side surface of the metal pad layer M may be exposed through the side surface of the semiconductor chip 200.

Referring to FIGS. 1, 2, and 9, a stepped structure through which an upper surface of third insulating layer 72 is exposed may be formed on at least one side surface of the semiconductor chip 200.

Figure 10:
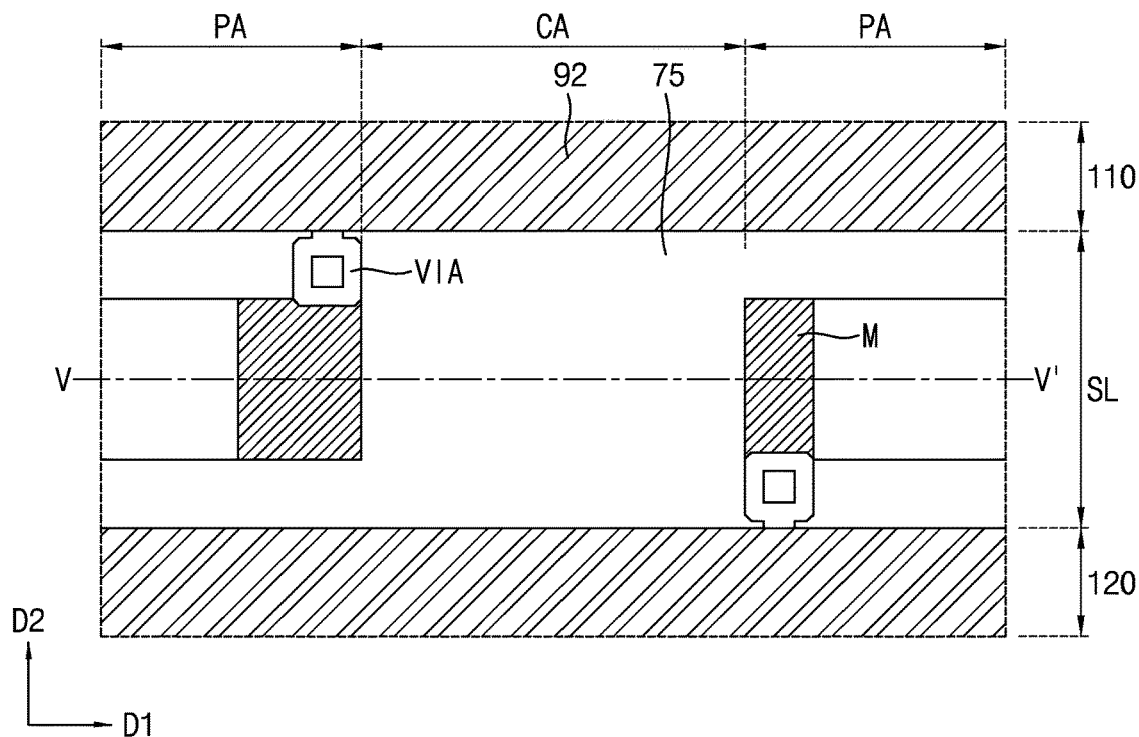
FIG. 10 is an enlarged view showing region A of FIG. 1 according to an example embodiment.
Figure 11:
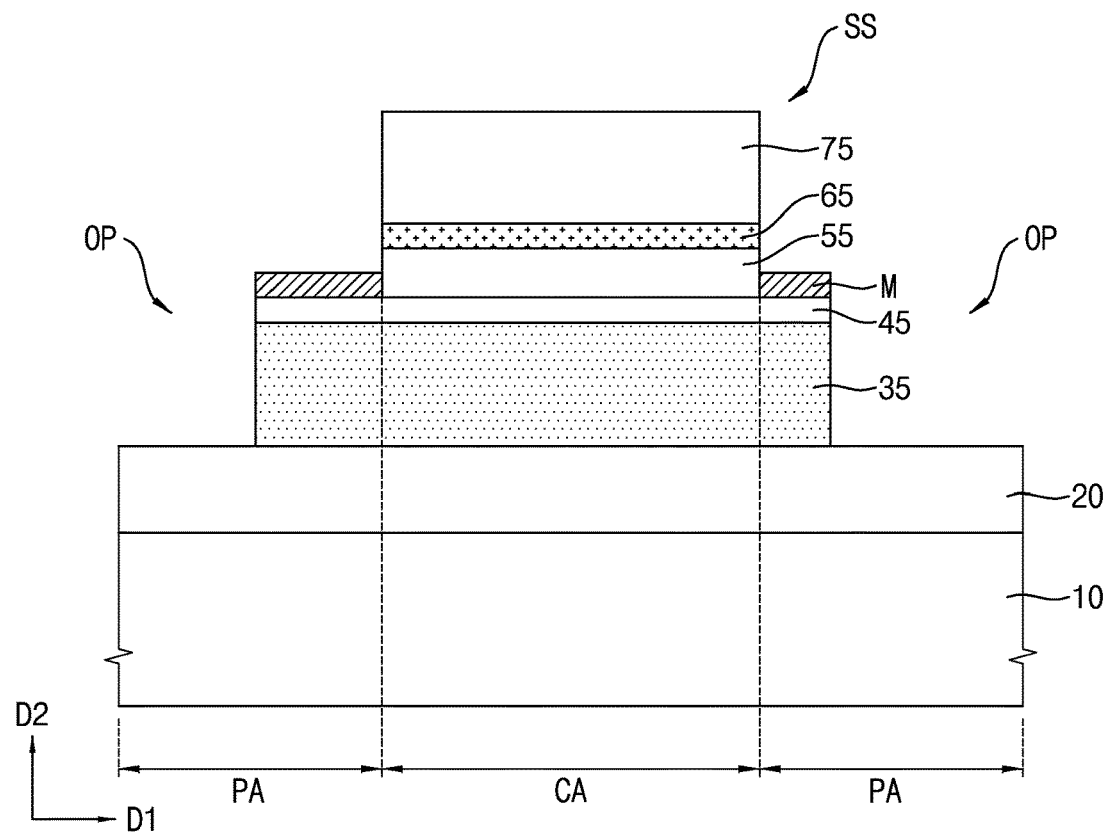
FIG. 11 is a vertical sectional view taken along line V-V' of FIG. 10.

FIG. 10 is an enlarged view showing region A of FIG. 1 according to an example embodiment. FIG. 11 is a vertical sectional view taken along line V-V' of FIG. 10. In FIGS. 1 to 11, like reference numerals denote like components. Hereinafter, for simplification of description, substantially the same contents as those described in FIGS. 1 to 9 will be omitted.

Referring to FIGS. 10 and 11, a stacked structure SS may be disposed on a lower interlayer insulating layer 20 on a scribe lane SL. The stacked structure SS may include a low-k dielectric layer 35, an upper interlayer insulating layer 45, passivation layers 55, 65, and 75, and metal pad layers M. The upper interlayer insulating layer 45 may be disposed on the low-k dielectric layer 35, and the passivation layers 55, 65, and 75 and the metal pad layers M may be disposed on the upper interlayer insulating layer 45.

The passivation layers 55, 65, and 75 may include a first insulating layer 55, a second insulating layer 65, and a third insulating layer 75, which are sequentially stacked on the upper interlayer insulating layer 45. Widths of the passivation layers 55, 65, and 75 in the first direction may be smaller than a width of the upper interlayer insulating layer 45 in the first direction.

The metal pad layers M may be disposed in contact with one side surface and another side surface of each of the passivation layers 55, 65, and 75. In the example embodiment, the metal pad layers M may be in contact with both side surfaces of the first insulating layer 55. A thickness of the metal pad layer M (in the thickness direction of FIG. 1) may be smaller than a thickness of the first insulating layer 55 in the thickness direction, but the example embodiment is not limited thereto. As shown in FIG. 11, when the metal pad layers M are in contact with the passivation layers 55, 65, and 75 in the first direction, vertical development (in the thickness direction) of cracks formed in the substrate 10 toward the passivation layers 55, 65, and 75 is facilitated by the support of the metal pad layers M as the semiconductor wafer 100 is cut. Therefore, the semiconductor chips 200 may be efficiently separated without peeling of the upper interlayer insulating layer 45 and/or the passivation layers 55, 65, and 75.

In a pad region PA, a via VIA may be disposed on the passivation layers 55, 65, and 75. The via VIA may be disposed such that at least a portion of the via VIA overlaps the metal pad layer M in the second direction.

FIGS. 12 to 18 are process cross-sectional views for describing a semiconductor wafer 100 having a cross section corresponding to a cross section taken along line I-I' of FIG. 2 and a method of manufacturing a semiconductor chip 200 formed by separating/cutting the semiconductor wafer 100. In FIGS. 1 to 18, like reference numerals denote like components. Hereinafter, for simplification of description, substantially the same contents as those described in FIGS. 1 to 11 will be omitted.

Figure 12:
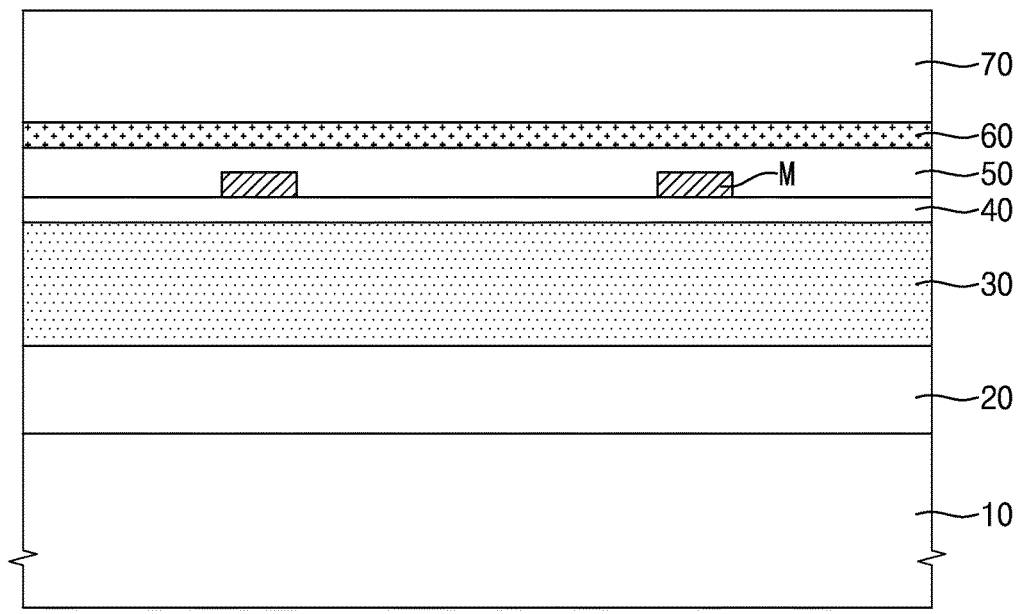
FIGS. 12 to 18 are cross-sectional views for describing a semiconductor wafer having a cross section corresponding to a cross section taken along line I-I' of FIG. 2 and a method of manufacturing a semiconductor chip formed by dividing the semiconductor wafer.

Referring to FIG. 12, a transistor (not shown in the drawing), a lower interconnection (not shown in the drawing), and a lower interlayer insulating layer 20 may be formed on a substrate 10. The substrate 10 may include a wafer. The transistor may include a metal-oxide-semiconductor field-effect transistor (MOSFET). The lower interlayer insulating layer 20 may include $SiO_2$.

A low-k dielectric layer 30 may be formed on the lower interlayer insulating layer 20. Although not shown in the drawing, the low-k dielectric layer 30 may be formed by alternately and repeatedly stacking inter-metal insulating layers including different materials. For example, the low-k dielectric layer 30 may be formed by alternately and repeatedly stacking a first inter-metal insulating layer (not shown in the drawing) including a low-k dielectric, a ultra-low-k dielectric, silicon nitride (SiN), and/or a combination thereof, and a second inter-metal insulating layer (not shown in the drawing) including silicon carbon nitride (SiCN). Although not shown in the drawing, metal patterns of the lower interlayer insulating layer 20, which are electrically connected to the transistor and the lower interconnection, may be disposed in the low-k dielectric layer 30.

An upper interlayer insulating layer 40 may be formed on the low-k dielectric layer 30. The upper interlayer insulating layer 40 may include SiN. Metal pad layers M may be formed on the upper interlayer insulating layer 40.

The metal pad layers M and passivation layers 50, 60, and 70 may be formed on the upper interlayer insulating layer 40. The metal pad layer M may include at least one of materials such as titanium (Ti), titanium nitride (TiN), tantalum (Ta), tantalum nitride (TaN), aluminum (Al), tungsten (W), nickel (Ni), copper (Cu), and other metals.

The passivation layers 50, 60, and 70 may include a first insulating layer, a second insulating layer and a third insulating layer which are sequentially stacked on the upper interlayer insulating layer 40. The first insulating layer 50 may cover the metal pad layers M. As an example, the first insulating layer 50 and the third insulating layer 70 may include oxide and the second insulating layer 60 may include nitride.

Figure 13:
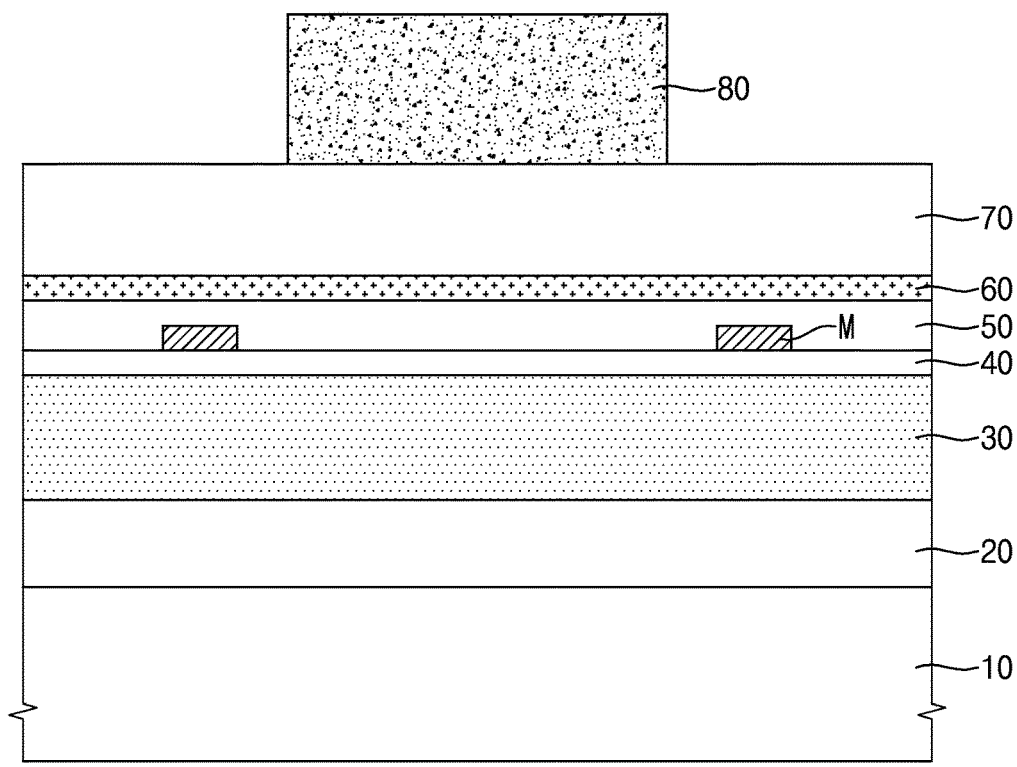
Figure 14:
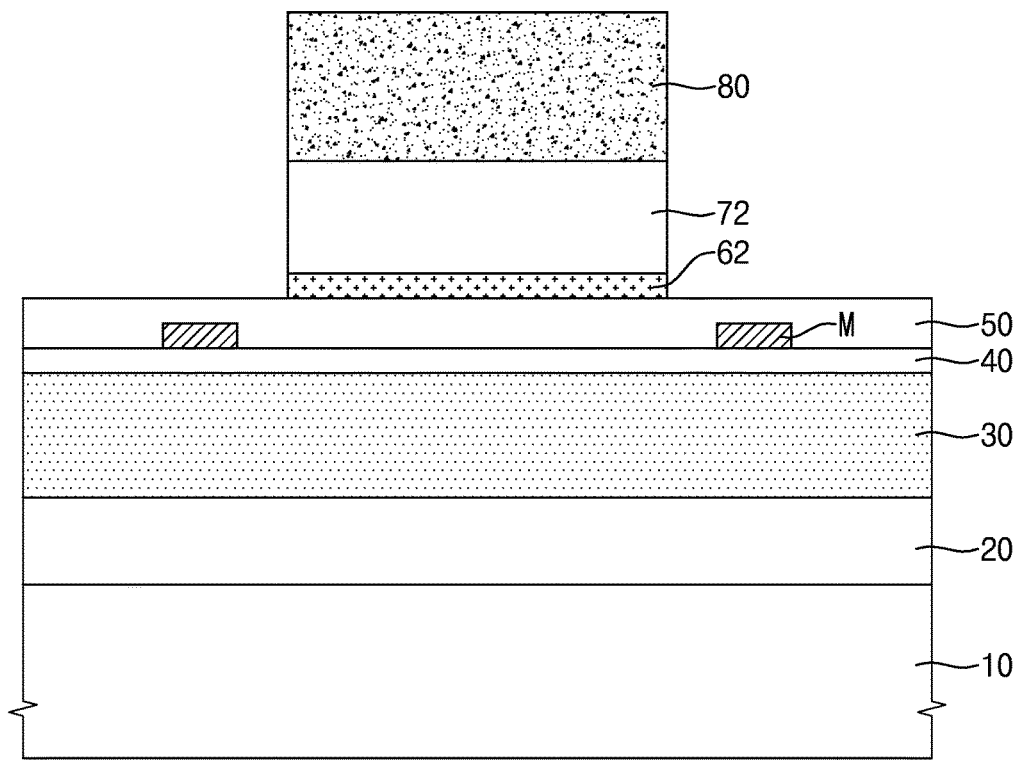
Figure 15:
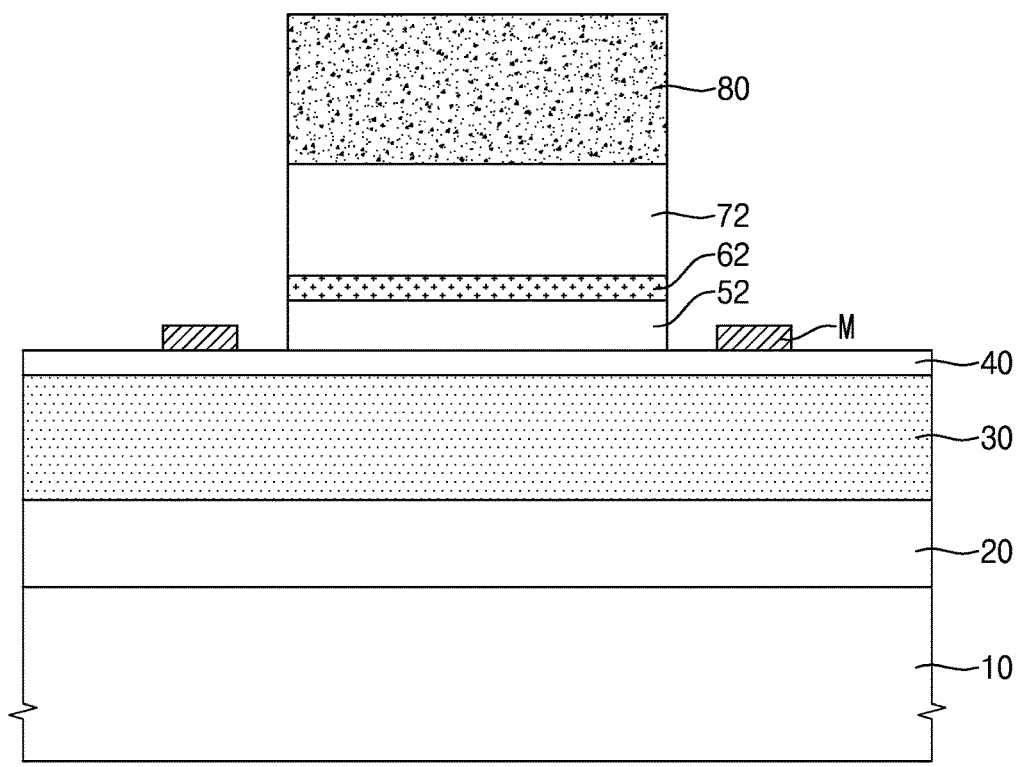

Referring to FIGS. 13 to 15, a mask pattern 80 may be formed on the passivation layers 50, 60, and 70. The passivation layers 50, 60, and 70 may be partially etched by an etching process using the mask pattern 80 as an etching mask and first to third insulating layers 52, 62, and 72 may be formed to be sequentially stacked on the upper interlayer insulating layer 40. An upper surface of the upper interlayer insulating layer 40 and surfaces of the metal pad layers M may be exposed on both sides of the first insulating layer 52.

Figure 16:
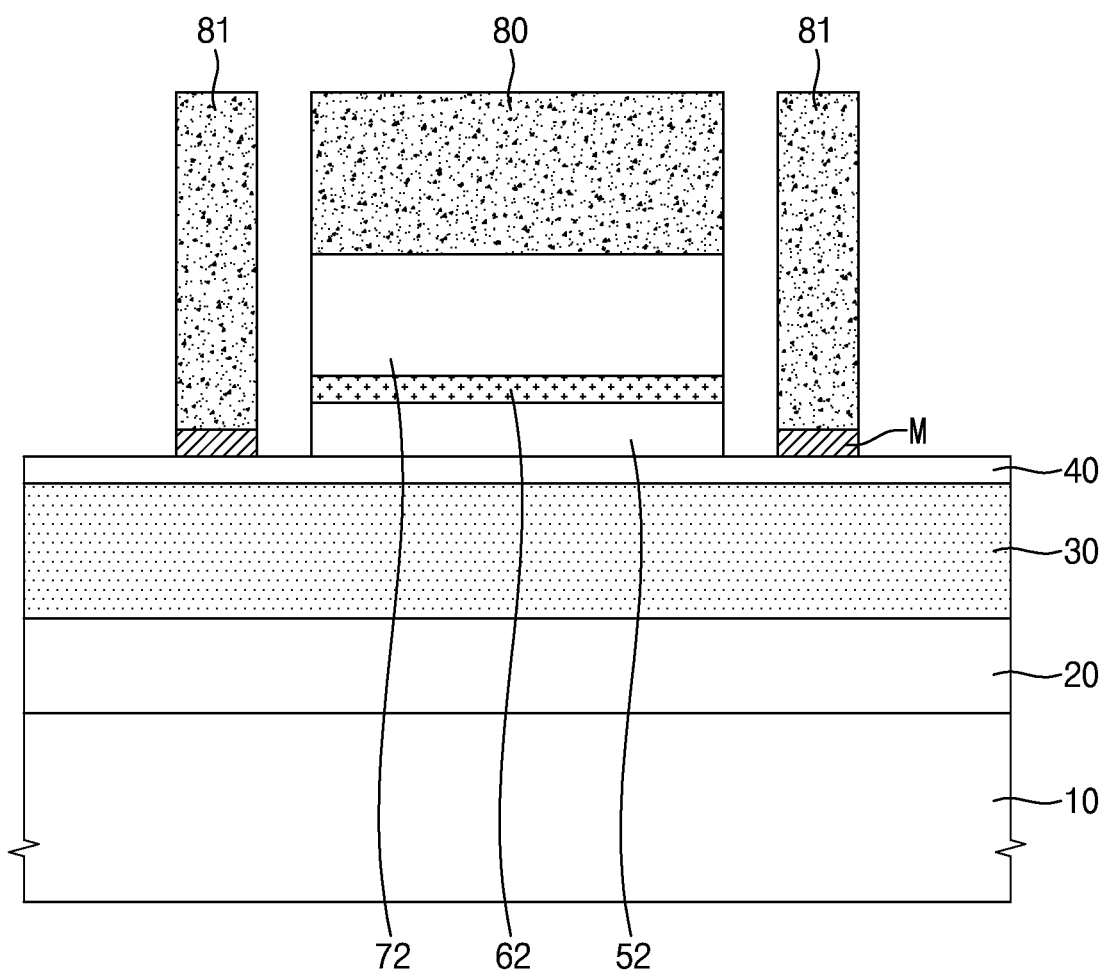
Figure 17:
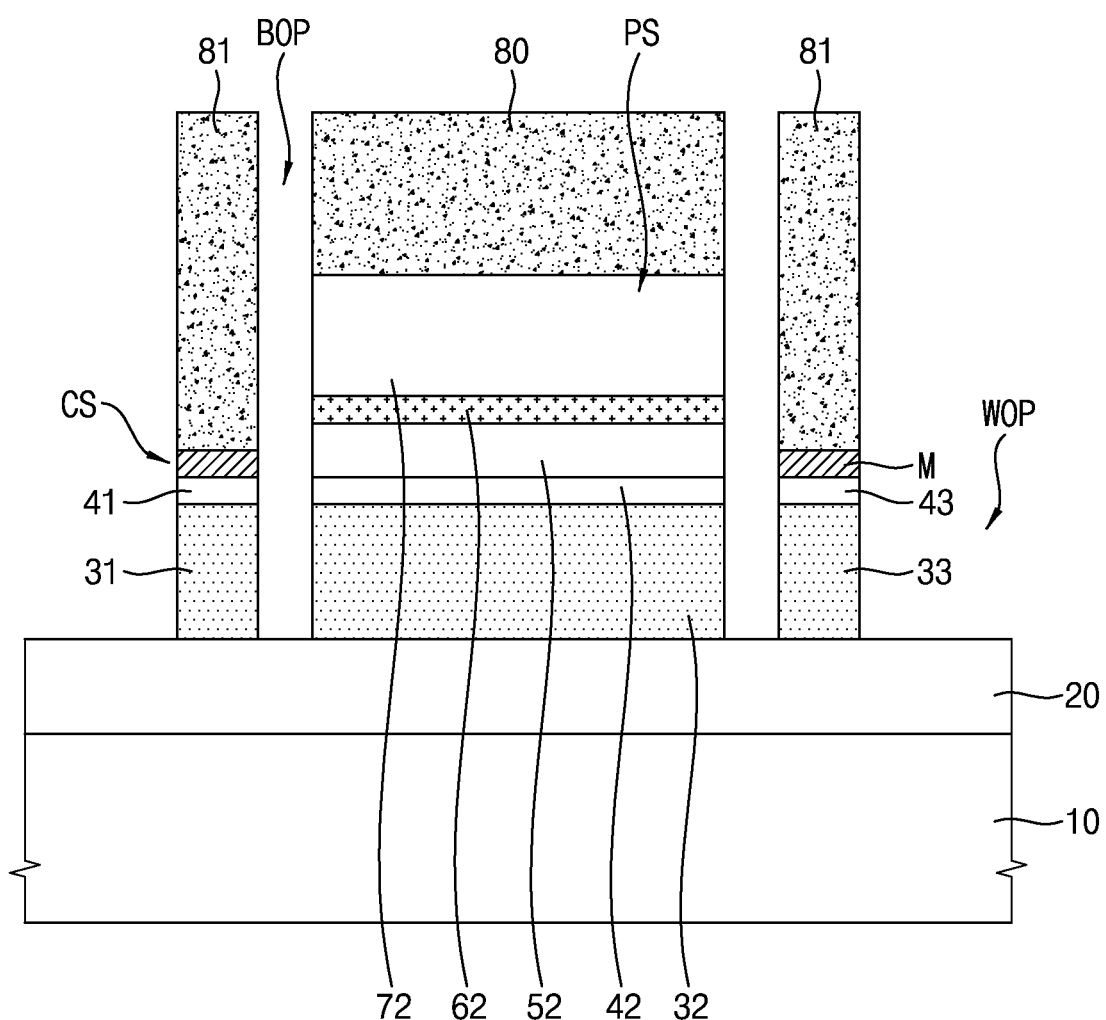

Referring to FIGS. 16 and 17, a mask pattern 81 may be formed on the third insulating layer 72 and the metal pad layers M, and the upper interlayer insulating layer 40 and the low-k dielectric layer 30 may be partially removed by an etching process using the mask pattern 81 as an etching mask. The upper interlayer insulating layer 40 and the low-k dielectric layer 30 may be etched to form a circuit structure CS and pad structures PS on the lower interlayer insulating layer 20. The pad structures PS may be formed on both sides of the circuit structure CS. A bridge open region BOP may be formed between the circuit structure CS and the pad structure PS and a wide open region WOP may be formed on both sides of the pad structure PS. The circuit structure CS may include the first to third insulating layers 52, 62, and 72, a low-k dielectric layer 32, and an upper interlayer insulating layer 42. The pad structure PS may include low-k dielectric patterns 31 and 33, upper interlayer insulating patterns 41 and 43, and the metal pad layers M. The mask pattern may be removed.

Figure 18:
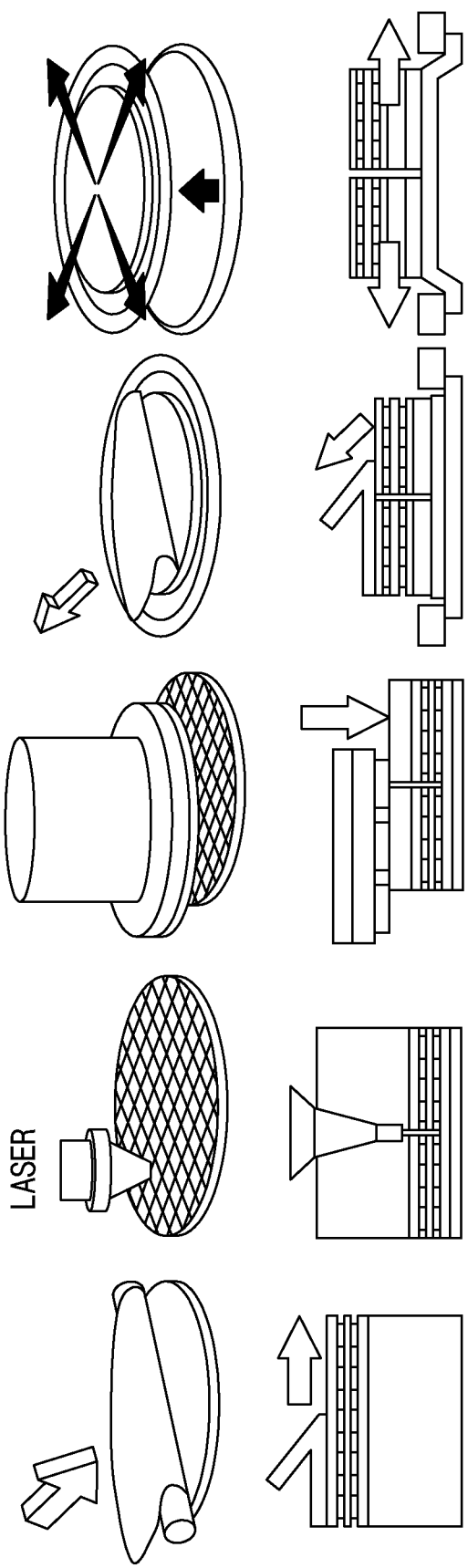

Referring to FIG. 18, a laser beam of a wavelength having penetrability with respect to a wafer substrate may be applied to the wafer substrate to form cracks in the substrate. Thereafter, the cracks may be vertically progressed toward a front surface of the substrate through pressure generated while back-grinding the wafer, and thus semiconductor chips may be separated from each other. In this case, in the inventive concept, dummy patterns may be disposed on both sides of an alignment key structure including a low-k dielectric layer, and thus cracks may be prevented from horizontally moving instead of vertically moving due to the low-k dielectric layer.

Figure 19:
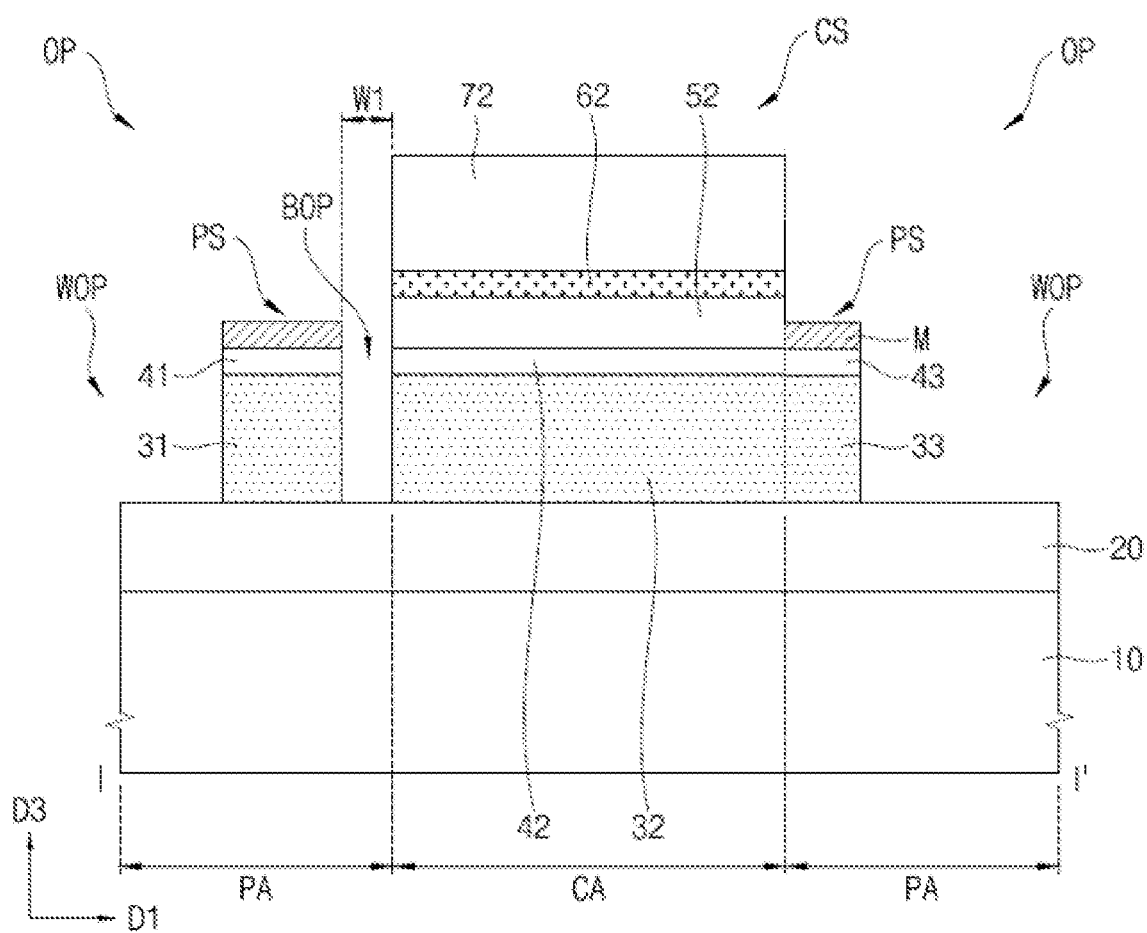
FIG. 19 a vertical sectional view of a semiconductor wafer according to example embodiment.

According to example embodiments, with reference to FIG. 19, one of the pad structure PS may be in contact with the circuit structure CS (which may also be referred to as a stacked structure) and the other one of the pad structure PS is disposed to be spaced apart from the circuit structure CS.

According to example embodiments of the inventive concept, in a laser sawing process of a semiconductor wafer including a low-k dielectric material, a peeling phenomenon (in which an insulating layer is peeled off when a wafer is cut) can be prevented, and semiconductor chips may be efficiently separated from one another.

While example embodiments have been described above, it should be understood by those skilled in the art that various modifications and variations could be made without departing from the spirit and the scope of the following claims.

What is claimed is:

1. A semiconductor chip comprising:
   a substrate comprising:
      a main chip region; and
      a scribe lane surrounding the main chip region;
   a lower interlayer insulating layer disposed on the substrate in the scribe lane;
   a circuit structure disposed on the lower interlayer insulating layer in the scribe lane; and
   a pad structure disposed on the lower interlayer insulating layer and comprising a low-k dielectric pattern, an upper interlayer insulating pattern, and a metal pad layer,
   wherein the circuit structure and the pad structure are disposed to be spaced apart from each other in a longitudinal direction of the scribe lane.

2. The semiconductor chip of claim 1, wherein a distance between the circuit structure and the pad structure in the longitudinal direction of the scribe lane is 8 µm or less.

3. The semiconductor chip of claim 1, wherein the pad structure comprises a first pad structure disposed on a first side of the circuit structure and a second pad structure disposed on a second side opposite to the first side along the longitudinal direction.

4. The semiconductor chip of claim 3, wherein a first distance between the circuit structure and the first pad structure is equal to a second distance between the circuit structure and the second pad structure.

5. The semiconductor chip of claim 3, wherein a first distance between the circuit structure and the first pad structure is different from a second distance between the circuit structure and the second pad structure.

6. The semiconductor chip of claim 3, wherein one of the first pad structure or the second pad structure is in contact with the circuit structure and the other one of the first pad structure or the second pad structure is disposed to be spaced apart from the circuit structure.

7. The semiconductor chip of claim 1,
   wherein a distance between the metal pad layer and the circuit structure in the longitudinal direction of the scribe lane is 8 µm or less.

8. The semiconductor chip of claim 1, wherein the circuit structure comprises:
   a low-k dielectric layer;
   an upper interlayer insulating layer; and
   a passivation layer, the low-k dielectric layer, the upper interlayer insulating layer and the passivation layer being sequentially stacked,
   wherein the metal pad layer comprises:

a first metal pad layer disposed on a first side of the passivation layer along the longitudinal direction; and a second metal pad layer disposed on a second side opposite to the first side of the passivation layer along the longitudinal direction, wherein the first metal pad layer disposed on the first side of the passivation layer is in contact with the passivation layer, and wherein the second metal pad layer disposed on the second side of the passivation layer is disposed to be spaced apart from the passivation layer.

9. The semiconductor chip of claim 1,
wherein the circuit structure comprises:
a low-k dielectric layer;
an upper interlayer insulating layer; and
a passivation layer, the low-k dielectric layer, the upper interlayer insulating layer and the passivation layer being sequentially stacked, and
wherein the semiconductor further comprises a via disposed on the passivation layer.

10. The semiconductor chip of claim 9, wherein a distance between the via and the circuit structure in the longitudinal direction of the scribe lane is 8 µm or less.

11. The semiconductor chip of claim 1, wherein the circuit structure comprises:
a low-k dielectric layer;
an upper interlayer insulating layer; and
a passivation layer, the low-k dielectric layer, the upper interlayer insulating layer and the passivation layer being sequentially stacked, and
wherein the passivation layer comprises:
a first insulating layer;
a second insulating layer; and
a third insulating layer, the first insulating layer, the second insulating layer and the third insulating layer being sequentially stacked, and
wherein the first insulating layer and the third insulating layer comprise oxide and the second insulating layer comprises nitride.

12. The semiconductor chip of claim 1, wherein an open region is provided directly between the circuit structure and the pad structure in the longitudinal direction, such that a side face of the circuit structure directly opposes a side face of the pad structure in the longitudinal direction.

13. A semiconductor chip comprising:
a substrate comprising:
a main chip region; and
a scribe lane surrounding the main chip region;
a stacked structure extending along a longitudinal direction of the scribe lane, provided on the substrate in the scribe lane and comprising a low-k dielectric material;
an open region in which the stacked structure is partially removed; and
a pad structure disposed in the open region and comprising a low-k dielectric pattern, an upper interlayer insulating pattern, and a metal pad layer,
wherein the pad structure is disposed to be spaced apart from the stacked structure in the longitudinal direction of the scribe lane.

14. The semiconductor chip of claim 13, wherein a distance between the stacked structure and the pad structure in the longitudinal direction of the scribe lane is 8 µm or less.

15. The semiconductor chip of claim 13,
wherein a distance between the metal pad layer and the stacked structure in the longitudinal direction of the scribe lane is 8 µm or less.

16. The semiconductor chip of claim 13, wherein the pad structure is disposed on each side of the stacked structure along the longitudinal direction and comprises:
a first pad structure; and
a second pad structure,
wherein the first pad structure disposed on a first side of the stacked structure is in contact with the stacked structure, and
wherein the second pad structure disposed on a second side opposite to the first side is disposed to be spaced apart from the stacked structure.

17. The semiconductor chip of claim 13, wherein the open region is provided directly between the stacked structure and the pad structure in the longitudinal direction, such that a side face of the stacked structure directly opposes a side face of the pad structure in the longitudinal direction.

* * * * *